United States Patent [19]

Minagawa

[11] 4,403,202
[45] Sep. 6, 1983

[54] SURFACE ACOUSTIC WAVE DEVICE AND METHOD FOR PRODUCING THE SAME

[75] Inventor: Shoichi Minagawa, Toda, Japan
[73] Assignee: Clarion Co., Ltd., Tokyo, Japan
[21] Appl. No.: 248,112
[22] Filed: Mar. 27, 1981

[30] Foreign Application Priority Data

Mar. 28, 1980 [JP] Japan ................................ 55-39079

[51] Int. Cl.³ ...................... H03H 9/145; H03H 9/42
[52] U.S. Cl. ................................ 333/150; 29/25.35; 310/313 R; 333/154
[58] Field of Search .............................. 333/150–155, 333/193–196; 330/5.5; 310/313 R, 313 A, 313 B, 313 C, 313 D; 29/25.35

[56] References Cited

U.S. PATENT DOCUMENTS 3,289,114 11/1966 Rowen ................................. 333/150
3,654,500 4/1972 Claiborne ........................... 29/25.35
3,840,824 10/1974 Bertoni et al. ..................... 333/150

OTHER PUBLICATIONS

Bowers et al., "Design and Applications of High Efficiency Wideband Saw Edge Bonded Transducers", 1978 Ultrasonics Symposium Proceedings, Cherry Hill, N.J., USA 25–27, Sep. 1978, IEEE CAt. #78 CH 1344-ISU; pp. 744–748.

Primary Examiner—Marvin L. Nussbaum
Attorney, Agent, or Firm—Flynn, Thiel, Boutell & Tanis

[57] ABSTRACT

A surface acoustic wave device wherein a laminated structure comprised of a piezoelectric member and a metal electrode or electrodes is provided on a surface acoustic wave surface of an elastic body and an acoustic impedance discontinuous face is formed on the elastic body, so that a longitudinal wave generated by the laminated structure is reflected by the acoustic impedance discontinuous face to provide a transverse wave.

15 Claims, 16 Drawing Figures

FIG. 7
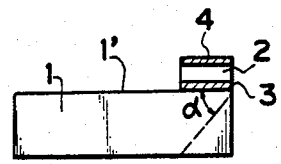
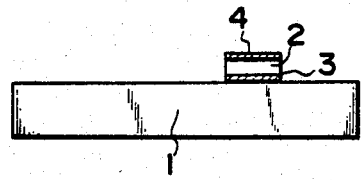
FIG. 8(i)
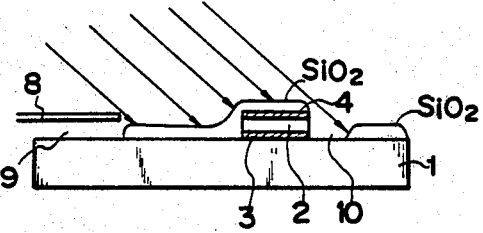
FIG. 8(ii)
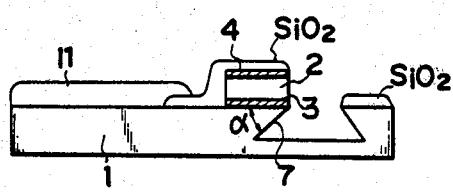
FIG. 8(iii)

SURFACE ACOUSTIC WAVE DEVICE AND METHOD FOR PRODUCING THE SAME

BACKGROUND OF THE INVENTION

1. Field of the Invention

This invention generally relates to a surface acoustic wave device, and more particularly to a surface acoustic wave transducer of high frequency and wide band which is capable of being manufactured easily and to a method for producing the same.

2. Description of the Prior Art

A conventional surface acoustic wave transducer of edge-bonded type is illustrated in FIG. 1. In the figure, 1 is an elastic member, 1' is a surface acoustic wave propagation face or surface, 2 is a piezoelectric member, 3 and 4 are electrodes, 5 is an electric signal input terminal and 6 is a surface acoustic wave.

As illustrated, to propagate the surface acoustic wave 6 on a face 1' of the elastic member 1, a laminated structure comprised of the electrodes 3 and 4 and the piezoelectric member 2 is provided, at an end face of the elastic substrate 1, and extends perpendicular to a propagation direction of the surface acoustic wave to be produced.

As to the dimensions of the piezoelectric member 2, the piezoelectric member 2 has an effective width a and a thickness b. If a wavelength of the surface acoustic wave at a center frequency thereof is assumed to be $\lambda_0$, $a \simeq \lambda_0$ and $b \simeq (\lambda_0/2)$.

When an AC voltage is applied to the electric signal input terminal 5, the piezoelectric member 2 vibrates. As a result, surface acoustic wave 6 is produced at an end portion of the face 1' of the elastic member 1 and propagated leftwardly as viewed in FIG. 1.

Although this conventional transducer has a wide-band characteristic, it is difficult to produce said transducer practically. As methods for producing this transducer, there can be mentioned:

(1) a method in which the piezoelectric member 2 is first formed and electrodes 3 and 4 are provided on opposite ends thereof, respectively, and the resultant assembly is bonded to the end face of the elastic material; and (2) a method in which the metal electrode 3 is vacuum deposited on the end face of the elastic member 1, the piezoelectric thin film 2 (e.g. zinc oxide etc.) and another metal electrode 4 are vacuum deposited thereon.

In either of the methods, it is difficult to practically manufacture the desired transducer. It is especially difficult when the center frequency $f_0$ is not high, because the lengths a and b are small. In addition, there is another problem with acoustic characteristics or aging of adhesives employed.

SUMMARY OF THE INVENTION

It is therefore an object of the present invention to provide a surface acoustic wave device which is capable of obviating the disadvantage involved in the conventional device.

In accordance with the present invention, there is provided a surface acoustic wave device which comprises:

an elastic member;

a laminated structure provided on a surface acoustic wave propagation path of said elastic member and comprised of at least one metal electrode and a piezoelectric member; and a means for applying an electric signal to said electrode;

said elastic member having an acoustic impedance discontinuous face;

said laminated structure generating a longitudinal wave upon application of the electric signal, said longitudinal wave being reflected by said acoustic impedance discontinuous face to provide a transverse wave.

BRIEF DESCRIPTION OF THE DRAWINGS

FIG. 7 is a diagrammatic view illustrating one method of the present invention;

FIGS. 8(i), 8(ii) and 8(iii) and FIG. 9 are diagrammatic views illustrating another method of the present invention.

DESCRIPTION OF THE EMBODIMENTS

Figure 1:
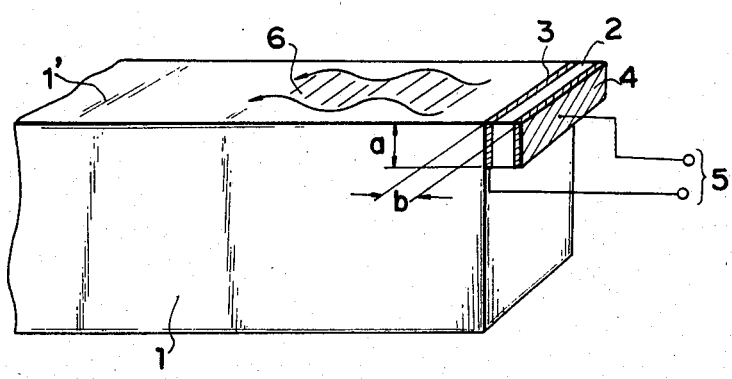
FIG. 1 is a schematic view of a conventional surface acoustic wave transducer.
Figure 2:
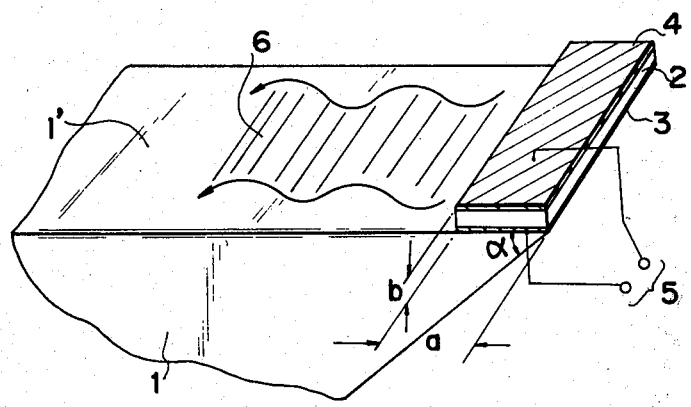
FIGS. 2 and 3 are schematic views of one embodiment of the present invention.
Figure 3:
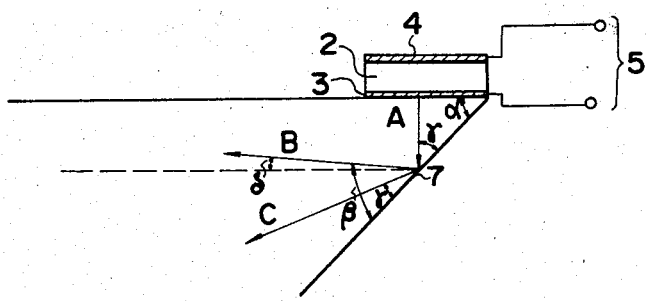

Referring now to the drawings, there are illustrated embodiments of the present invention. In FIGS. 2 and 3, the same numerals as those in FIG. 1 designate the same parts or portions. 7 is an acoustic impedance discontinuous face or surface (a longitudinal wave reflecting face) of the elastic member 1. The face 7 is formed by cutting the elastic member 1 at an angle $\alpha$ with reference to a surface acoustic wave propagation face 1' so that it includes a point on a surface acoustic wave propagation path near an edge portion of a laminated structure and a point beneath the laminated structure.

The laminated structure is formed, for example, in a strip shape and is provided on the surface acoustic wave surface 1' propagation path of the elastic member 1, so as to extend perpendicularly to the surface acoustic wave.

When an AC voltage is applied to metal electrodes 3 and 4 provided on lower and upper faces of the piezoelectric member 2 of the laminated structure, respectively, from a terminal 5, vibration is caused by expansion and contraction of the piezoelectric member 2 thereby to produce a longitudinal wave A in the elastic member 1 which, as shown in FIG. 3, travels away from surface 1' in a direction generally perpendicular thereto. This longitudinal wave A is reflected by the acoustic impedance discontinuous face 7 and divided into a longitudinal wave C and a transverse wave B which, as shown in FIG. 3, travels approximately parallel to surface 1'.

Since the transverse wave B has, at a depth of about a wavelength of the surface acoustic wave from the surface 1' of the elastic member 1, vibration components similar to those of the surface acoustic wave, the transverse wave B is effectively converted into a surface acoustic wave as at 6.

Figure 4:
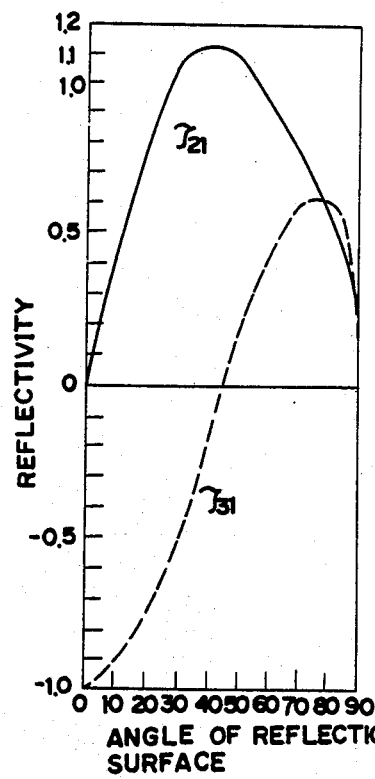
FIGS. 4 and 5 are characteristic curves showing reflectance characteristics of respective devices according to the present invention.

FIG. 4 includes characteristic curves showing calculation examples of changes, with the reflecting face angle α, of an amplitude ratio Γ₂₁ (reflectance) between the reflected transverse wave B and the incident longitudinal wave A and an amplitude ratio Γ₃₁ between the reflected longitudinal wave C and the incident longitudinal wave A when molten quartz is used as the elastic member 1. As apparent from FIG. 4, it is desirable, to effectively convert the incident longitudinal wave A into the reflected transverse wave B, to select an angle α at which Γ₂₁ is large and the absolute value of Γ₃₁ is small. Therefore, in the example of FIG. 4, it is preferred that the angle α be in the range of $20° < α < 60°$.

Figure 5:
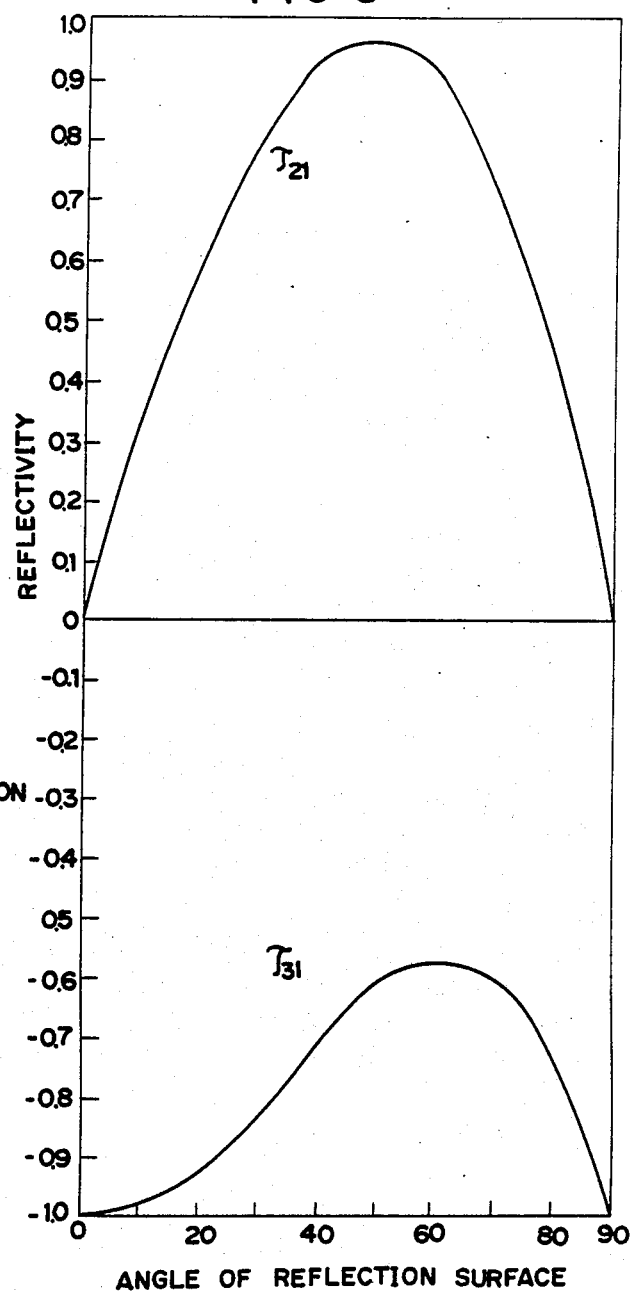

FIG. 5 shows a similar calculation example wherein copper is used as the elastic member 1. In this example, a preferable range of α is $30° < α < 75°$, as apparent from FIG. 5.

Thus, the surface acoustic wave transducer of the present invention operates effectively when the angle α is selected with the range of $20° < α < 75°$.

Assuming that the propagation speed of the transverse wave B (FIG. 3) is $V_{sv}$ and the propagation speed of the longitudinal wave C (FIG. 3) is $V_L$, there is the following relation between α and β (an angle defined by the direction of the transverse wave and the discontinuous face 7):

$$\cos β = (V_{sv}/V_L) \sin α, \; δ = β - α$$

To convert the produced transverse wave B into a surface acoustic wave effectively, δ is preferably as small as possible, nearing to zero. Therefore, to design the surface acoustic wave transducer of the present invention which is capable of generating a surface acoustic wave effectively, α may be selected within the range of $20° < α < 75°$ from the valves of $V_{sv}$ and $V_L$ so that δ may near zero.

As to the width in the depth direction of the transverse wave B, the wave B can most effectively be converted into a surface acoustic wave when said width substantially corresponds to the penetration depth of the surface acoustic wave, i.e., the wavelength $λ_0$ of the surface acoustic wave. Assuming that effective widths of the piezoelectric member 2 and the metal electrodes 3 and 4 are a, the desired transducer may be designed so as to have a relation of $a \tan α ≃ λ_0$.

Figure 6:
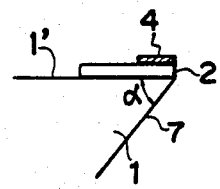
FIG. 6 is a schematic view of another embodiment of the present invention.

FIG. 6 illustrates another form of surface acoustic wave device embodying the present invention.

The device of the present invention can be manufactured easily by common photolithography because the piezoelectric member assembly is positioned on the surface acoustic wave propagation face. Methods suitable for producing the surface acoustic wave device of the present invention are given as follows:

(1) As illustrated in FIG. 7, an elastic material substrate 1 is formed in a square wafer and one end thereof is ground to have an angle α. Then, a metal 3 is evaporated on a surface 1' and a piezoelectric material 2 is deposited thereon by evaporation etc. A metal 4 is further deposited on the piezoelectric material 2 by evaporation. Thereafter, unnecessary portions are removed by photoetching etc.

(b) When silicon Si or gallium arenside GaAs is used as a material of the elastic material substrate 1, a manner and speed of chemical etching is varied depending on directional properties of crystals. By employing this selective etching method, the desired angle α of the acoustic impedance discontinuous face can be obtained.

For example, as illustrated in FIG. 8 (i), the laminated structure comprised of the metal 3, the piezoelectric member 2 and the metal 4 is formed on the substrate 1 by evaporation and photoetching. Thereafter, SiO₂ etc. is obliquely evaporated, as illustrated in FIG. 8 (ii), on the resulting assembly with a portion 9 of a suitable size adjacent to the laminated structure left unevaporated using an evaporation mask 8. As a result, a window 10 is formed on the right side of the laminated structure as can be seen in FIG. 8 (ii). A photoresist film 11 is formed at the portion 9. Then, selective etching is effected at the window 10 to form a face having the angle α. The SiO₂ film and the photoresist film 11 are removed thereafter.

By the employment of oblique evaporation for forming etching-resist film (SiO₂ film), an operation of mask registration may be omitted and fine processing is enabled.

Figure 9:
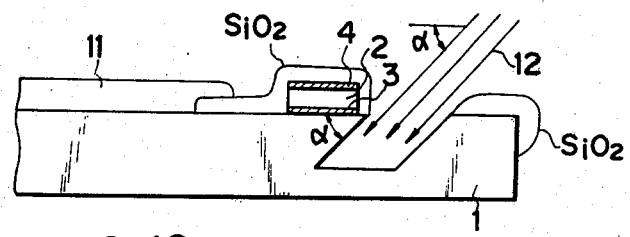

(3) Instead of the selective chemical etching, etching by directive ion beam as illustrated in FIG. 9 or dry etching such as ion milling may be employed to form the end face having the angle α.

Figure 10:
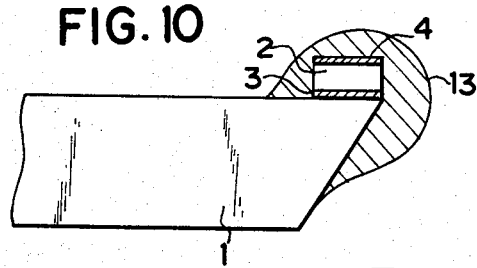
FIGS. 10, 11, 12, 13 and 14 are schematic views of various modifications of the present invention.
Figure 11:
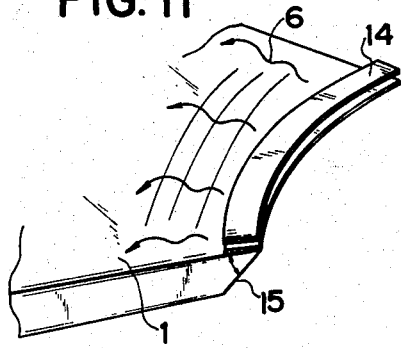
Figure 12:
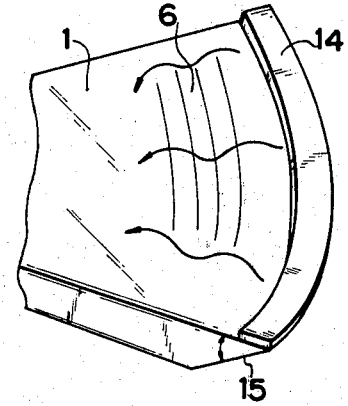
Figure 13:
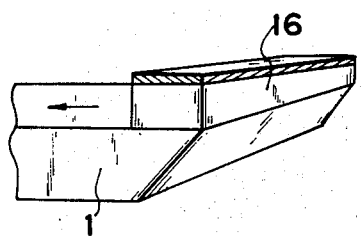
Figure 14:
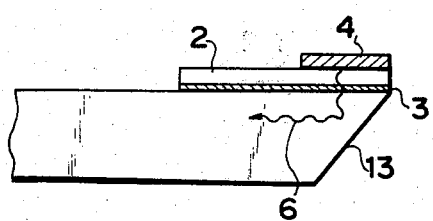

FIGS. 10 to 14 illustrate various modifications of the present invention. In FIG. 10, 13 is an end-face protecting member covering the laminated structure and the reflecting face of the elastic member 1. It is preferred that the protecting member 13 have a sufficient difference in acoustic impedance relative to the elastic material. FIGS. 11 and 12 each illustrate an arcuate acoustic wave generator having an arcuate laminated structure 14 and reflecting face 15. FIG. 13 illustrates a tapered transducer having a tapered laminated structure 16 which is suitable for widening a band. FIG. 14 is a modification wherein a metal electrode 4 has a width different from those of a metal electrode 3 and a piezoelectric member 2.

As apparent from the foregoing description, the surface acoustic wave device of the present invention has the following advantages:

(1) to have a wide band;
(2) to be manufactured easily and to be practical as compared with the conventional edge-bonded transducer;
(3) to have a high productivity by employing a planar technique;
(4) to be particularly effective to generate surface acoustic waves on an elastic material made of Si or GaAs;
(5) to be capable of generating surface acoustic waves on an integrated circuit;
(6) to be free from the problem of adhesives involved in the conventional edge-bonded transducer;
(7) to be capable of being manufactured by photolithography so that surface acoustic waves of very high frequency can be obtained; and
(8) to be excellent in converting efficiency because a longitudinal transducer can be employed.

The embodiments of the invention in which an exclusive property or privilege is claimed are defined as follows:

1. A surface acoustic wave device, comprising:
an elastic member having a first surface, a surface acoustic wave propagation path extending along said first surface, and a second surface which extends at an acute angle with respect to said first surface;
a laminated structure provided on said first surface of said elastic member at a location along said surface acoustic wave propagation path, said laminated structure including a piezoelectric member and two metal electrodes which are provided on opposite sides of said piezoelectric member, one of said electrodes being disposed against said first surface; and means for applying an electric signal to said electrodes;

said laminated structure generating a first wave in said elastic member traveling away from said first surface approximately normal thereto in response to application of said electric signal, said first wave being reflected by said second surface to provide a second wave traveling in said elastic member approximately parallel to said surface acoustic wave propagation path, said second wave producing a surface acoustic wave traveling along said surface acoustic wave propagation path at said first surface of said elastic member.

2. A surface acoustic wave device according to claim 1, wherein said laminated structure is elongate and extends along said first surface substantially perpendicular to said surface acoustic wave propagation path.

3. A surface acoustic wave device according to claim 1, wherein the width of said one metal electrode in the direction of said surface acoustic wave propagation path is approximately equal to the wavelength of said surface acoustic wave.

4. A surface acoustic wave device according to claim 1, wherein said second surface is arranged at an angle within the range of from 20° to 75° relative to said first surface.

5. A surface acoustic wave device according to claim 1, wherein the width of said laminated structure in the direction of said surface acoustic wave propagation path is approximately equal to $\lambda \div \tan \alpha$, where $\alpha$ is the angle defined by said first surface relative to said second surface and $\lambda$ is the wavelength of said surface acoustic wave.

6. A surface acoustic wave device according to claim 1, including protecting means for covering said laminated structure and said second surface.

7. A surface acoustic wave device according to claim 2, wherein said elongate laminated structure and said second surface are arcuate.

8. A surface acoustic wave device according to claim 1, wherein said laminated structure is tapered.

9. A surface acoustic wave device according to claim 1, wherein said one metal electrode has a width different than that of said piezoelectric member.

10. A method for producing a surface acoustic wave device, comprising the steps of forming an elastic substrate having a first surface, then depositing a first metal film onto said first surface, then depositing a piezoelectric film onto said first metal film, then depositing a second metal film onto said piezoelectric film, said metal and piezoelectric films forming a laminated structure, thereafter evaporating an etching-resist material onto said device so as to leave a window adjacent and on one side of said laminated structure, then applying etching to said elastic member at said window to form a second surface which is arranged at an acute angle with respect to said first surface, said first and second surfaces each including a point which is located near an edge portion of said laminated structure and said second surface including a point contained in a line which passes through said laminated structure generally perpendicular to said first surface, and thereafter removing said etching-resist material from said device.

11. A method for producing a surface acoustic wave device according to claim 10, wherein said etching step includes selective chemical etching.

12. A method for producing a surface acoustic wave device according to claim 10, wherein said evaporating step includes oblique evaporation.

13. A method for producing a surface acoustic wave device, comprising the steps of forming an elastic substrate having a first surface, then depositing a first metal film onto said first surface, then depositing a piezoelectric film onto said first metal film, then depositing a second metal film onto said piezoelectric film, said metal and piezoelectric films forming a laminated structure, thereafter evaporating an etching-resist material onto said device so as to leave a window adjacent and on one side of said laminated structure, then removing material from said elastic member at said window to form a second surface which is arranged at an acute angle with respect to said first surface, and then removing said etching-resist material.

14. A method for producing a surface acoustic wave device according to claim 13, wherein said step of removing material from said elastic member at said window includes oblique irradiation by an ion beam.

15. A method for producing a surface acoustic wave device according to claim 13, wherein said evaporating step includes oblique evaporation.

* * * * *